(12) United States Patent
Jones et al.

(10) Patent No.: US 7,973,242 B2
(45) Date of Patent: Jul. 5, 2011

(54) VERTICAL CABLE MANAGER

(75) Inventors: Trent Jones, White Bear Lake, MN (US); Jeremy Fink, Anoka, MN (US); Marcus Adrian Koukkari, Duluth, MN (US); Brian Lynn Mordick, Shoreview, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 141 days.

(21) Appl. No.: 12/206,601

(22) Filed: Sep. 8, 2008

(65) Prior Publication Data

US 2009/0090538 A1    Apr. 9, 2009

Related U.S. Application Data

(60) Provisional application No. 60/967,677, filed on Sep. 6, 2007.

(51) Int. Cl.
*H02G 3/00* (2006.01)

(52) U.S. Cl. ......... 174/100; 174/101; 174/68.3; 211/26; 439/719

(58) Field of Classification Search ................. 174/101, 174/68.3, 72 A, 100; 439/719; 211/26, 85; 361/826, 829
See application file for complete search history.

(56) References Cited

U.S. PATENT DOCUMENTS

| | | | |
|---|---|---|---|
| 555,766 A | 3/1896 | Pletcher | |
| 1,381,335 A | 6/1921 | Reed | |
| 2,140,376 A | 12/1938 | Anderson | |
| 2,531,110 A | 11/1950 | Cisler | |
| 2,817,870 A | 12/1957 | Howell | |
| 2,848,826 A | 8/1958 | Heble | |
| 2,921,607 A | 1/1960 | Caveney | |
| 3,008,177 A | 11/1961 | Wooten, Jr. | |
| 3,024,301 A | 3/1962 | Walch | |
| 3,346,688 A | 10/1967 | Fields | |
| 3,485,937 A | 12/1969 | Caveney | |
| 3,488,795 A | 1/1970 | Marguelisch | |
| 3,705,949 A | 12/1972 | Weiss | |
| 3,890,459 A | 6/1975 | Caveney | |
| 3,966,074 A | 6/1976 | Hotchkiss et al. | |
| 3,968,322 A | 7/1976 | Taylor | |
| 4,046,957 A | 9/1977 | Taylor et al. | |
| 4,099,819 A | 7/1978 | Keglewitsch | |
| 4,136,257 A | 1/1979 | Taylor | |

(Continued)

FOREIGN PATENT DOCUMENTS

EP    0555187    8/1993

(Continued)

OTHER PUBLICATIONS

U.S. Appl. No. 10/992,640, McGrath et al.

(Continued)

*Primary Examiner* — Dhiru R Patel
(74) *Attorney, Agent, or Firm* — Quarles & Brady LLP

(57) ABSTRACT

Embodiments of the invention provide a vertical cable manager for routing cables or wires. The vertical cable manager includes a vertical trough with sets of fingers. The fingers include arrow-shaped ends, which allow installation and/or removal of cables and wires, while retaining the cables and wires in cable rings. In some embodiments, a door attached to the vertical cable manager can be removable from one or both sides of the trough. In some embodiments, the vertical cable manager can include removable spools that can be attached to the trough in various positions and configurations.

20 Claims, 9 Drawing Sheets

U.S. PATENT DOCUMENTS

| | | | |
|---|---|---|---|
| 4,484,020 A | 11/1984 | Loof et al. |
| 4,613,174 A | 9/1986 | Berg et al. |
| 4,641,225 A | 2/1987 | Reichle |
| 4,649,658 A | 3/1987 | Sarton et al. |
| 4,719,321 A | 1/1988 | Kozel et al. |
| 4,752,249 A | 6/1988 | Unger et al. |
| 4,902,852 A | 2/1990 | Wuertz |
| 5,023,404 A | 6/1991 | Hudson et al. |
| 5,089,667 A | 2/1992 | Goussin et al. |
| 5,115,377 A | 5/1992 | Dransman |
| 5,187,836 A | 2/1993 | Kim et al. |
| 5,241,136 A | 8/1993 | Michaelis et al. |
| 5,326,934 A | 7/1994 | LeMaster et al. |
| 5,402,515 A | 3/1995 | Vidacovich et al. |
| D360,189 S | 7/1995 | Orlando |
| 5,542,549 A | 8/1996 | Siemon et al. |
| 5,586,012 A | 12/1996 | Lerman |
| 5,597,980 A | 1/1997 | Weber |
| 5,715,348 A | 2/1998 | Falkenberg et al. |
| 5,788,087 A | 8/1998 | Orlando |
| 5,836,551 A | 11/1998 | Orlando |
| 5,918,837 A | 7/1999 | Vicain |
| 5,921,402 A | 7/1999 | Magenheimer |
| 5,964,611 A | 10/1999 | Jacob et al. |
| 6,005,188 A | 12/1999 | Teichler et al. |
| 6,102,214 A | 8/2000 | Mendoza |
| 6,107,575 A | 8/2000 | Miranda |
| 6,107,576 A | 8/2000 | Morton et al. |
| 6,118,075 A | 9/2000 | Baker et al. |
| 6,140,584 A | 10/2000 | Baldissara |
| 6,170,784 B1 | 1/2001 | MacDonald et al. |
| 6,215,064 B1 | 4/2001 | Noble et al. |
| 6,223,909 B1 | 5/2001 | Mendoza |
| 6,245,998 B1 | 6/2001 | Curry et al. |
| 6,259,851 B1 | 7/2001 | Daoud |
| 6,347,714 B1 | 2/2002 | Fournier et al. |
| 6,365,834 B1 | 4/2002 | Larsen et al. |
| 6,403,885 B1 | 6/2002 | Baker, III et al. |
| 6,437,243 B1 | 8/2002 | VanderVelde et al. |
| 6,438,309 B1 | 8/2002 | Franz |
| 6,467,633 B1 | 10/2002 | Mendoza |
| 6,468,112 B1 | 10/2002 | Follingstad et al. |
| 6,489,565 B1 | 12/2002 | Krietzman et al. |
| 6,513,289 B1 | 2/2003 | Decore et al. |
| 6,541,705 B1 | 4/2003 | McGrath |
| 6,600,107 B1 | 7/2003 | Wright et al. |
| 6,605,782 B1 | 8/2003 | Krietzman et al. |
| 6,614,978 B1 | 9/2003 | Caveney |
| 6,766,093 B2 | 7/2004 | McGrath et al. |
| 6,796,437 B2 | 9/2004 | Krampotich et al. |
| 6,884,942 B2 | 4/2005 | McGrath et al. |
| 7,000,784 B2 | 2/2006 | Canty et al. |
| 7,026,553 B2 | 4/2006 | Levesque et al. |
| 7,119,282 B2 | 10/2006 | Krietzman et al. |
| 7,178,679 B2 | 2/2007 | Canty et al. |
| 7,379,650 B2 * | 5/2008 | Weinert et al. ............... 385/137 |
| 2005/0247650 A1 | 10/2005 | Vogel et al. |
| 2006/0080646 A1 | 4/2006 | Aman |
| 2006/0091086 A1 | 5/2006 | Canty et al. |
| 2006/0213853 A1 | 9/2006 | Schluter et al. |

FOREIGN PATENT DOCUMENTS

| WO | WO 99/52190 | 10/1999 |
|---|---|---|
| WO | WO 02/075887 | 9/2002 |

OTHER PUBLICATIONS

Panduit Communication Products, Panduit Corporation, pp. D33, D34, D35, date unknown.
Panduit Corporation Installation Instructions Sheet, 1999.
B-Line Telecom Equipment Supports, B-Line Systems, Inc., Highland Park, Illinois, date unknown.
Hubbell Premise Wiring 2U Horizontal Cable MGMT Panel Assembly Drawing, date unknown.
Siemon Co. Terminal Block Cover Photographs, date unknown.

* cited by examiner

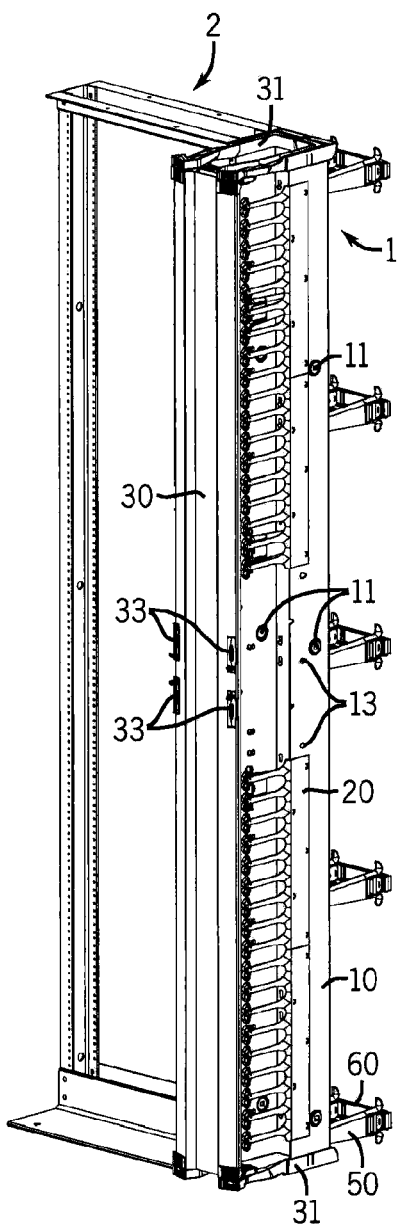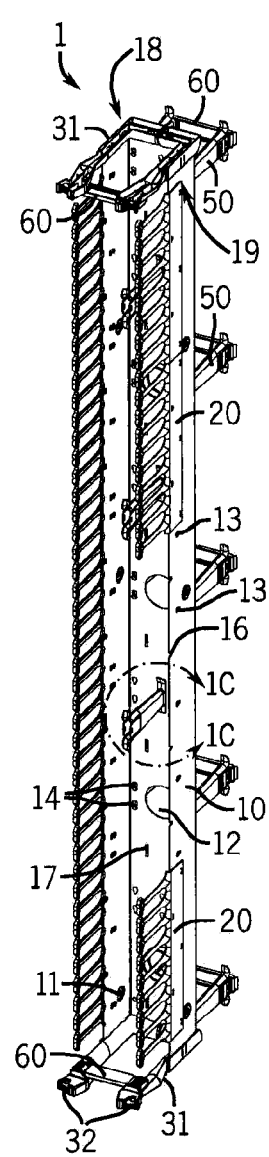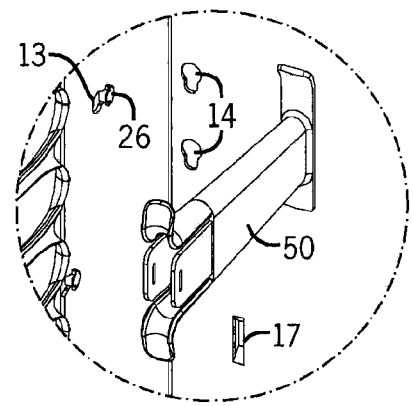
FIG. 1C
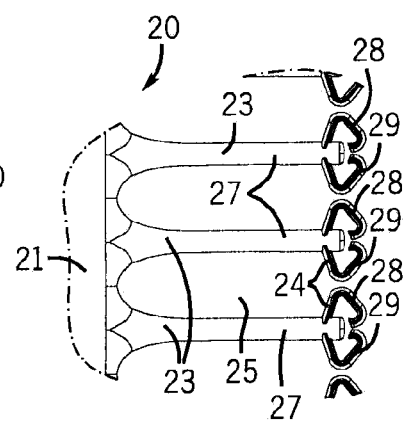
FIG. 1D
FIG. 1A
FIG. 1B

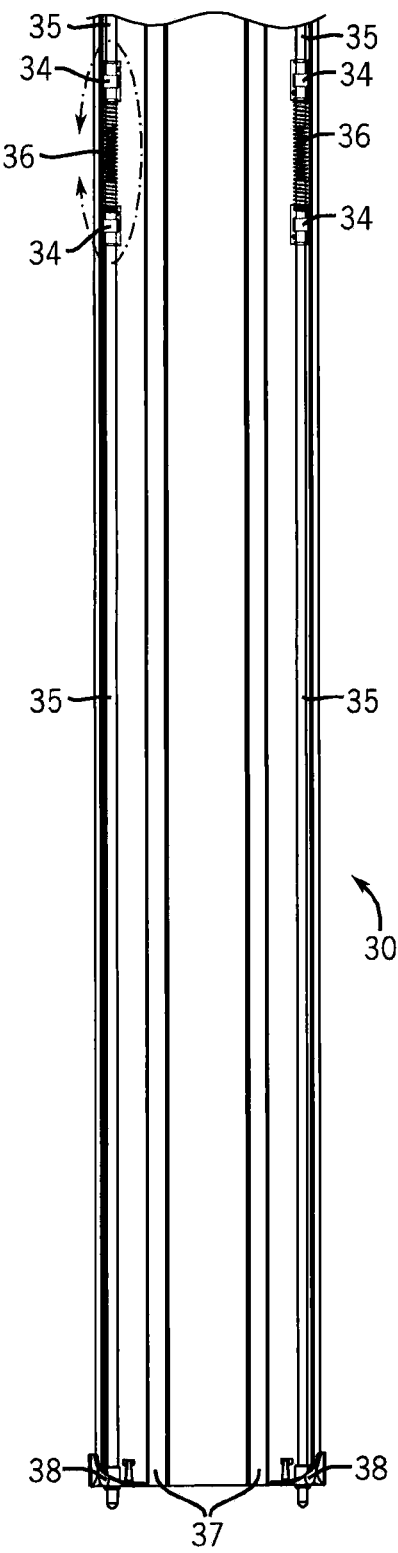
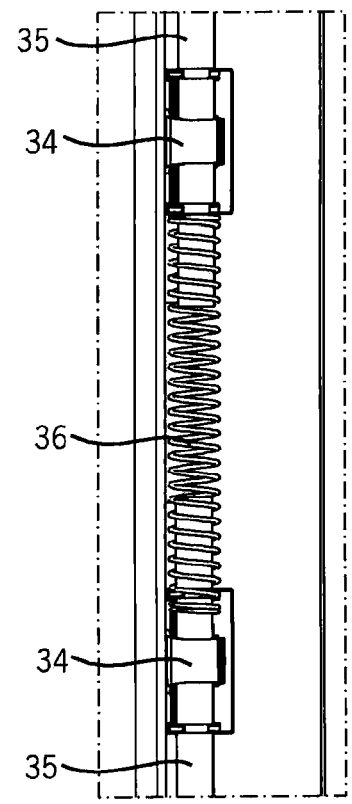
FIG. 3A
FIG. 3B

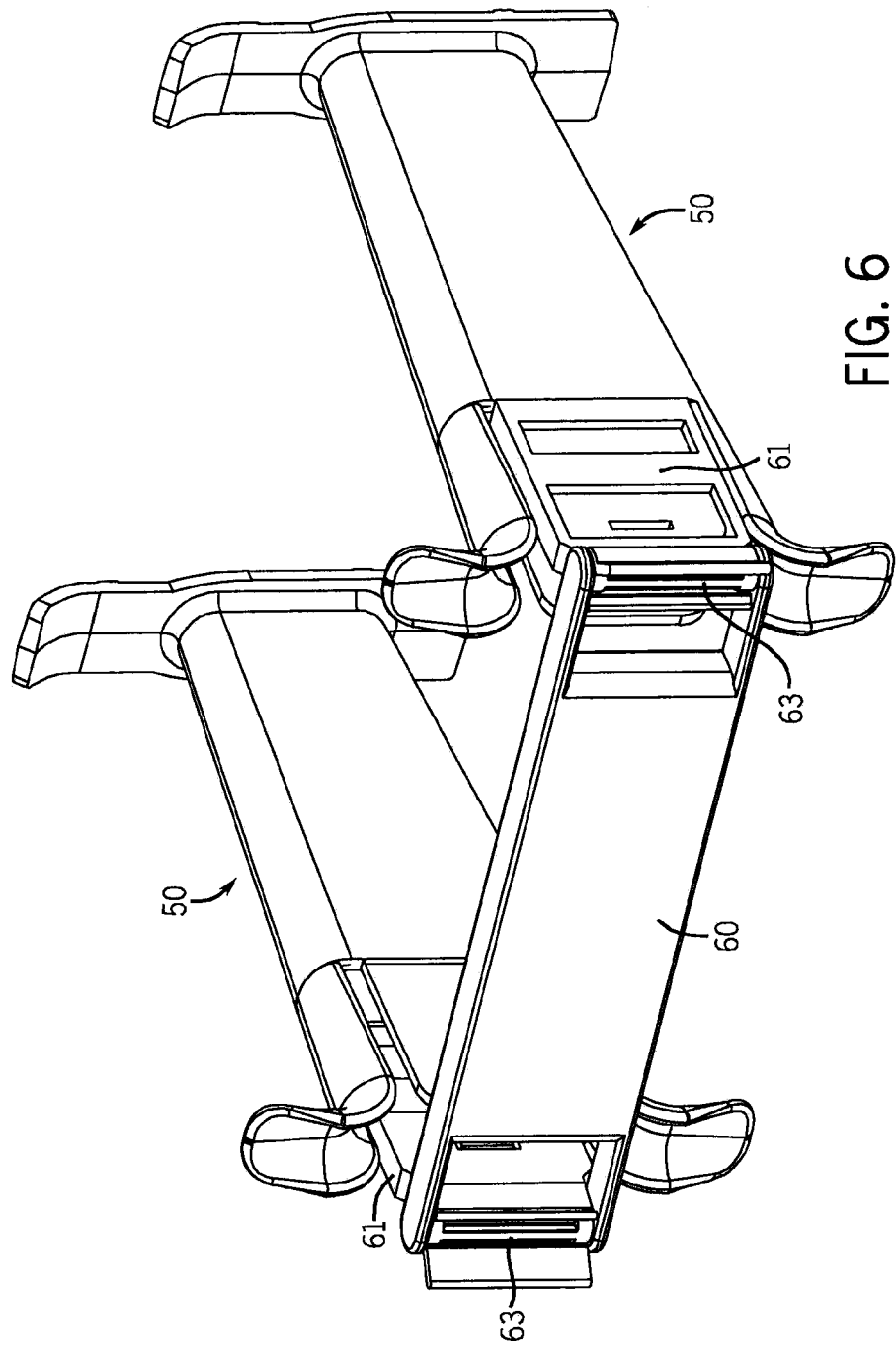

VERTICAL CABLE MANAGER

RELATED APPLICATIONS

This application claims priority to U.S. Provision Application No. 60/967,677, filed Sep. 6, 2007, the entire contents of which are incorporated herein by reference.

BACKGROUND

Advances in the area of modern electrical equipment result in smaller dimensions of the electrical devices and increases in features. Since the width of the electrical equipment is standardized to fit into the bay of common racks, frames or cabinets, the height or vertical dimension of the equipment reduces in size. This, in combination with a possible addition of features of the equipment, results in a high density of wiring connections.

The routing of the cables and wires must be well arranged in order to allow easy and quick installation, removal, and servicing of the electrical equipment. This calls for cable managing devices allowing large numbers of wires or cables to enter and/or exit at specific locations in a direct and manageable manner. Although a cable manager must be large enough to accommodate a high capacity of wires and cables, it also must be compact enough to avoid loose hanging or slack wiring. With the numerous possible configurations of the electrical equipment inside frames, racks or cabinets, the cable manager should incorporate versatile features to adapt to many configurations.

SUMMARY

Some embodiments of the invention provide a vertical cable manager for routing cables or wires in a direct and manageable manner. The vertical cable manager can include one or more sets of fingers that extend along the vertical length of the cable manager. The fingers can include an arrow-shaped end. Cables and wires can be received between two adjacent fingers between two adjacent arrow-shaped ends. Some embodiments of the vertical cable manager can also include spools that can be attached in various positions along the vertical length of the cable manager. A single spool can then be used to wrap excess cable. Two spools positioned horizontally adjacent to one another and connected by a crossbar can form a vertical raceway. Additionally, other embodiments of the vertical cable manager can include a door that can pivot between an open position, in which the ends of the fingers can be accessed, and a closed position, in which ends of the fingers can be substantially covered.

Other aspects of the invention will become apparent to those skilled in the art by reading the detailed description of preferred embodiments and considering attached drawings.

DESCRIPTION OF THE DRAWINGS

FIG. 1A is a front perspective view of a vertical cable manager according to one embodiment of the invention coupled to an electronic equipment rack.

FIG. 1B is a front perspective view of the vertical cable manager of FIG. 1A.

FIG. 1C is a detailed front perspective view of a spool for use with the vertical cable manager of FIGS. 1A and 1B.

FIG. 1D is a side view of fingers of the vertical cable manager of FIGS. 1A-1B.

FIG. 3A is a back view of a door and its spring-loaded operating mechanism of the vertical cable manager of FIGS. 1A-1B.

FIG. 3B is a detailed view of the spring-loaded operating mechanism of FIG. 3A.

FIG. 6 is a perspective view of an assembly of two spools of FIG. 4 connected by the cross member of FIG. 5A.

DETAILED DESCRIPTION

Figure 1E:
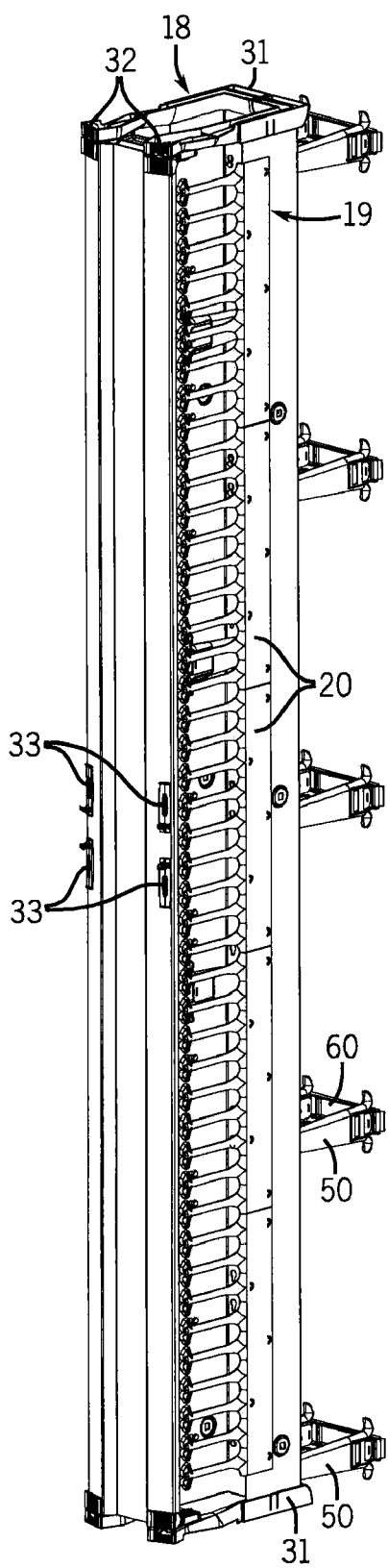
FIG. 1E is a side perspective view of the vertical cable manager of FIG. 1A.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

FIG. 1A illustrates a vertical cable manager 1 according to one embodiment of the invention. The vertical cable manager 1 is coupled to a rack 2 by fasteners 11 or other suitable means. FIG. 1B illustrates the vertical manager 1 with its door 30 removed for clarity. The vertical cable manager 1 can include a U-shaped trough 10 including fasteners 11 for coupling the vertical cable manager 1 to a rack 2. The U-shaped trough 10 includes openings 12 covered by a ring 15 (as shown in FIG. 1F) to guide cables or wires to the opposite side of the vertical cable manager 1. The ring 15 can help prevent the cables or wires from being damaged when routed through the openings 12. Holes 13 can be positioned along the side walls of the trough 10 in order to substantially permanently attach a set of fingers 20 through fixtures 26, as shown in FIG. 1C. To provide guidance for the installation of the set of fingers 20, the trough 10 can include one or more notches 16. A set of fingers 20 can include as little as two fingers, but can include any suitable number of fingers. Also, as shown in FIG. 1C, the trough 10 can include several key-hole shaped apertures 14 to accommodate spools 50 on either side of the trough 10. For example, a single spool 50 can be used to wind up slack cabling.

FIG. 1D illustrates the set of fingers 20 including a base 21 and fingers 23 extending generally horizontally from the base 21. At a distance away from the distal tip of the fingers 23 are two triangular-shaped extensions forming an arrow-shaped end 24. The flexible nature of the arrow-shaped ends 24 allows for installation and/or removal of a single or multiple wires or cables.

Figure 1F:
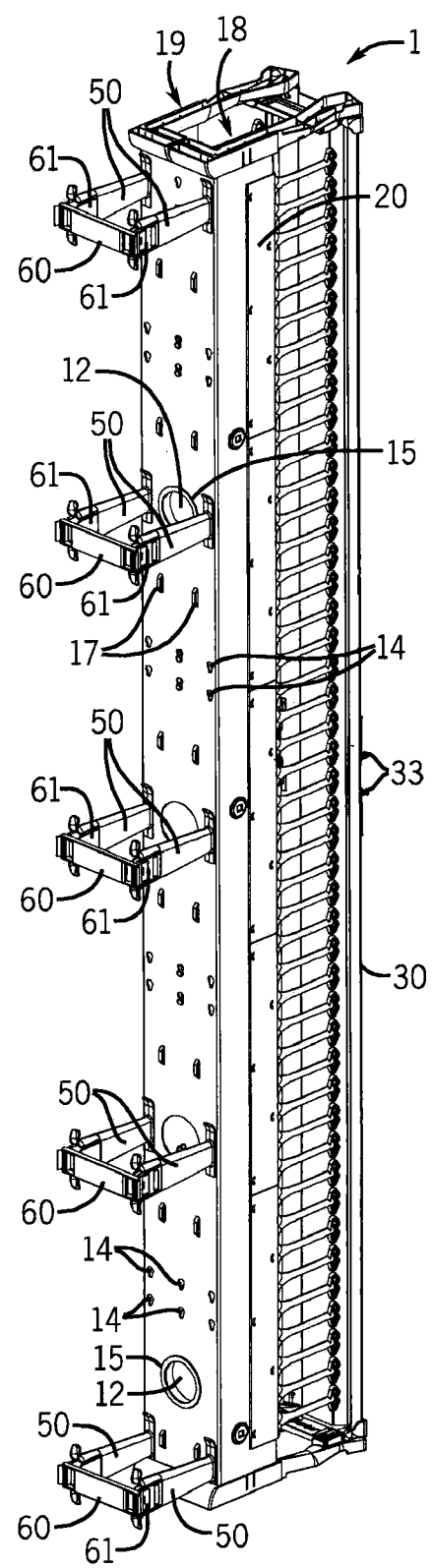
FIG. 1F is a back perspective view of the vertical cable manager of FIG. 1E.

FIG. 1E illustrates the vertical cable manager 1 and the door 30 in the closed position. The door 30 can be hinged to both sides 18, 19 of the trough 10 by U-shaped brackets 31. The U-shaped brackets 31 can be mounted to the top and bottom of the trough 10. Other suitable positions between the sets of fingers 20 and the ends of the trough 10 are also possible. The door 30 allows for not only lateral installation of cables but also allows wiring to enter and/or exit the top and/or bottom of the trough 10. The door 30 can be opened in either direction by operating one set of handles 33 or can be completely removed by operating both sets of handles 33 on opposite sides of the door 30.

FIG. 1F illustrates a back side of the vertical cable manager 1. The key-hole shaped apertures 14 and the openings 12 including their ring covers 15 are included in the trough 10. Two spools 50 can be horizontally aligned and connected with a cross member 60 by using two connectors 61. One or more pairs of spools 50 can be created and positioned along the length of the trough 10 to create a raceway, as further described below. One or more cables or wires can be attached to a slot 17 by straps, cable ties or other suitable means.

Figure 2A:
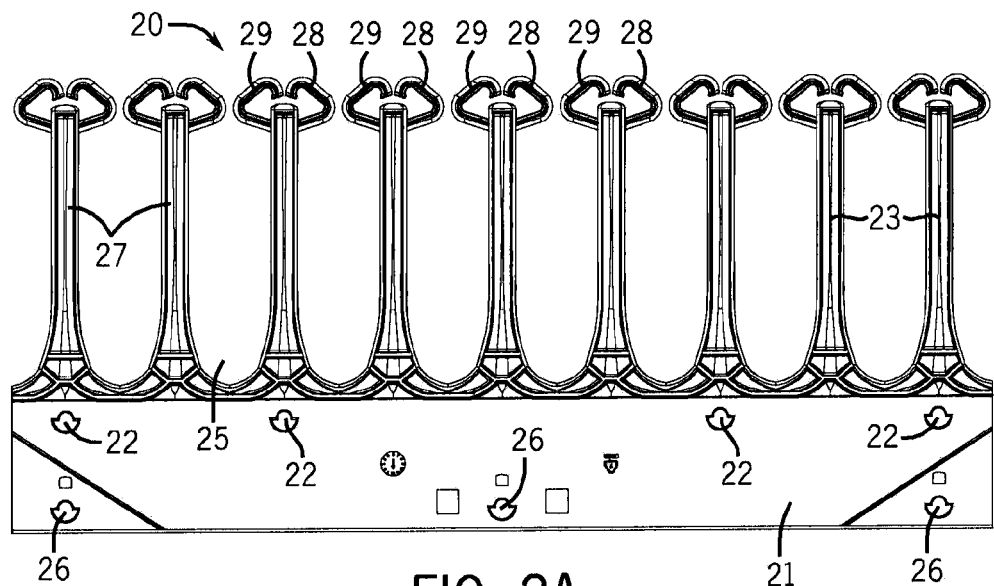
FIG. 2A is a side view a set of fingers of the vertical cable manager of FIGS. 1A-1B.
Figure 2B:
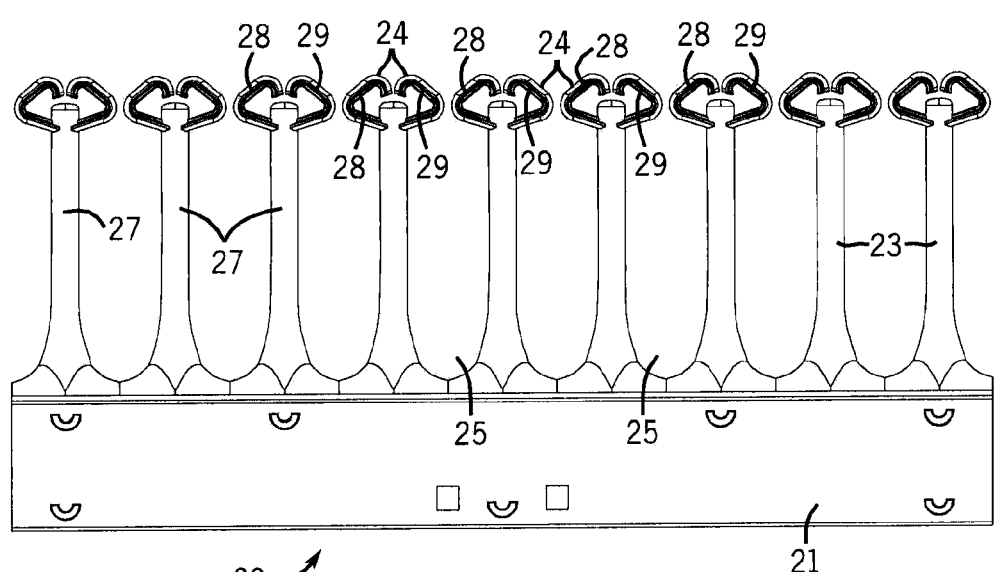
FIG. 2B is another side view of a set of fingers of the vertical cable manager of FIGS. 1A-1B.

FIGS. 2A-2B further illustrate the set of fingers 20. FIG. 2A illustrates the base 21 including two different kinds of fixtures. A fixture 22 closer to the fingers 23 is used to guide the set of fingers 20 into place during installation. A fixture 26 closer to the bottom portion of the base 21 couples the set of fingers 20 to the trough 10 by a one-way snap-on connection or another suitable connection. FIG. 2B illustrates a cable ring 25 formed between two adjacent fingers 23 which accommodates groups of cables and wires. When installed, the base of the cable rings 25 extends over the side wall of the trough 10 to protect routed cables and wires from possible damage by the trough 10 (e.g., especially if the trough 10 is constructed of metal). At a distance from the distal end of the shaft 27 of each finger 23, two triangular-shaped extensions 28, 29 form an arrow-shaped end 24. More specifically, the arrow-shaped end 24 includes a first triangular member 28 coupled to the shaft 27 at a first distance away from a distal end of the shaft 27, and a second triangular member 29 coupled to an opposite side of the shaft 27 at the first distance away from the distal end of the shaft 27. The arrow-shaped ends 24 are aligned to form openings with a width smaller than the width of the cable ring 25 in order to help retain the cables and wires within the cable ring 25 once they are passed by the arrow-shaped ends 24.

Figure 3C:
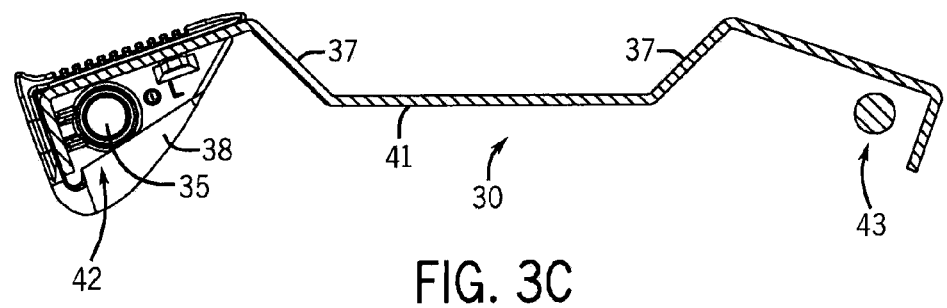
FIG. 3C is a cross-sectional profile of the door of FIG. 3A.

FIGS. 3A-3D illustrate the door 30 and its various components. FIG. 3A illustrates a back or interior portion of the door 30. The door 30 pivots about latch rods 35 installed along channels 42, 43 on either side of the door 30. FIG. 3B illustrates the latch rod 35 attached to a latch 34 which is moved by a handle 33 (as shown in FIGS. 1A and 1E) from the front side of the door 30 to form a retractable hinge. The latch rod 35 can be connected to springs 36 which can bias the latch rods 35 to their resting state. Each latch rod 35 can attach to the door 30 by one or more hinge guides 38. The ends of the latch rod 35 can include rounded tips for smooth operation of the door 30.

Figure 3D:
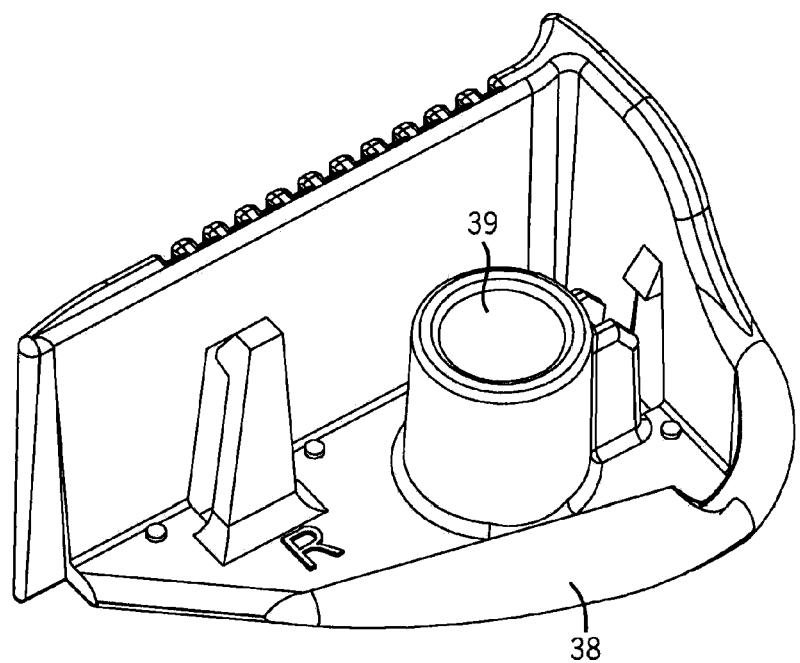
FIG. 3D is a perspective view of a door hinge guide of the door of FIG. 3A.

FIG. 3C illustrates a cross-sectional profile of the door 30. Parallel to the longitudinal portion of the door 30 are two oblique guards 37 (one for each side of the door 30) to help prevent the wiring from interfering with the operation of the door 30. Between these oblique guards 37 can be a plane surface 41 which can be smooth substantially throughout the height of the door 30. The plane surface 41 can allow contact by cables or wires without causing damage. The plane surface 41 can extend the capacity of the vertical cable manager 1 and/or provide additional space when cables and wires are routed through the holes 12 from the opposite side of the trough 10. FIG. 3D illustrates the hinge guide 38 which attaches to the door 30. The latch rod 35 can be passed through the bushing 39 forming the axis of rotation for the door 30.

Figure 4:
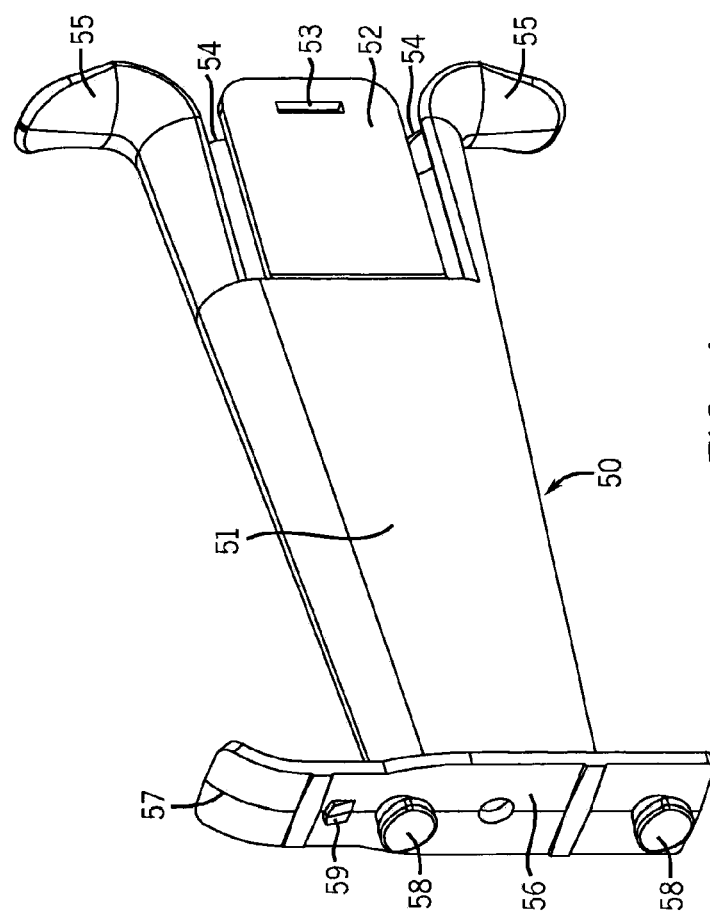
FIG. 4 is a back perspective view of a spool for use with the vertical cable manager of FIGS. 1A-1B.
Figure 5A:
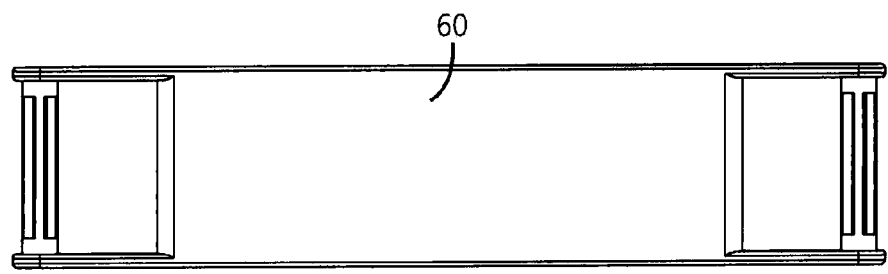
FIG. 5A is a front view of a cross member of the vertical cable manager of FIGS. 1A-1B.
Figure 5B:
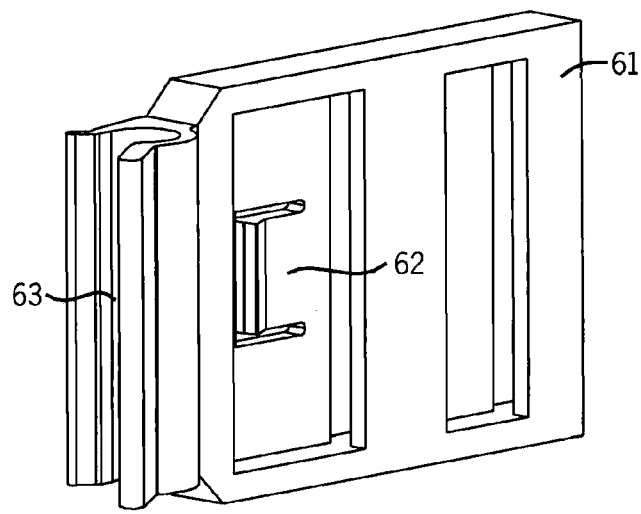
FIG. 5B is a perspective view of a connector to attach the cross member of FIG. 5A.

FIG. 4 illustrates the spool 50 before installation in the key holes 14 of the trough 10. A hollow elongated body 51 of the spool 50 can be used to wrap up excess cables or wires. Rounded end plates 55 located at the upper and lower distal end of the spool 50 help wound up wiring stay in place. Horizontal slots 54 provide an attachment location for the cross member 60 (as shown in FIGS. 5A and 6) by separating a lip 52 from the hollow body 51 on each side of the spool 50. The lips 52 can be coupled to the connector 61 (as shown in FIG. 5B) by notches 53. Fasteners 58 can be used to mount the spool 50 to the trough 10. The fasteners 58 can be located on the base plate 56 of the spool 50. A small wedge 59 also located on the base plate 56 can help prevent the spool 50 from unintentional removal. In case an installed spool would need to be re-positioned, a bended lip 57 is provided to help disengage the small wedge 59 and allow for removal of the spool 50 from the keyholes 14. Throughout the design of the spool 50, all edges and welts are rounded up to a degree that no damage to the cables and wires is likely to occur.

Figure 7:
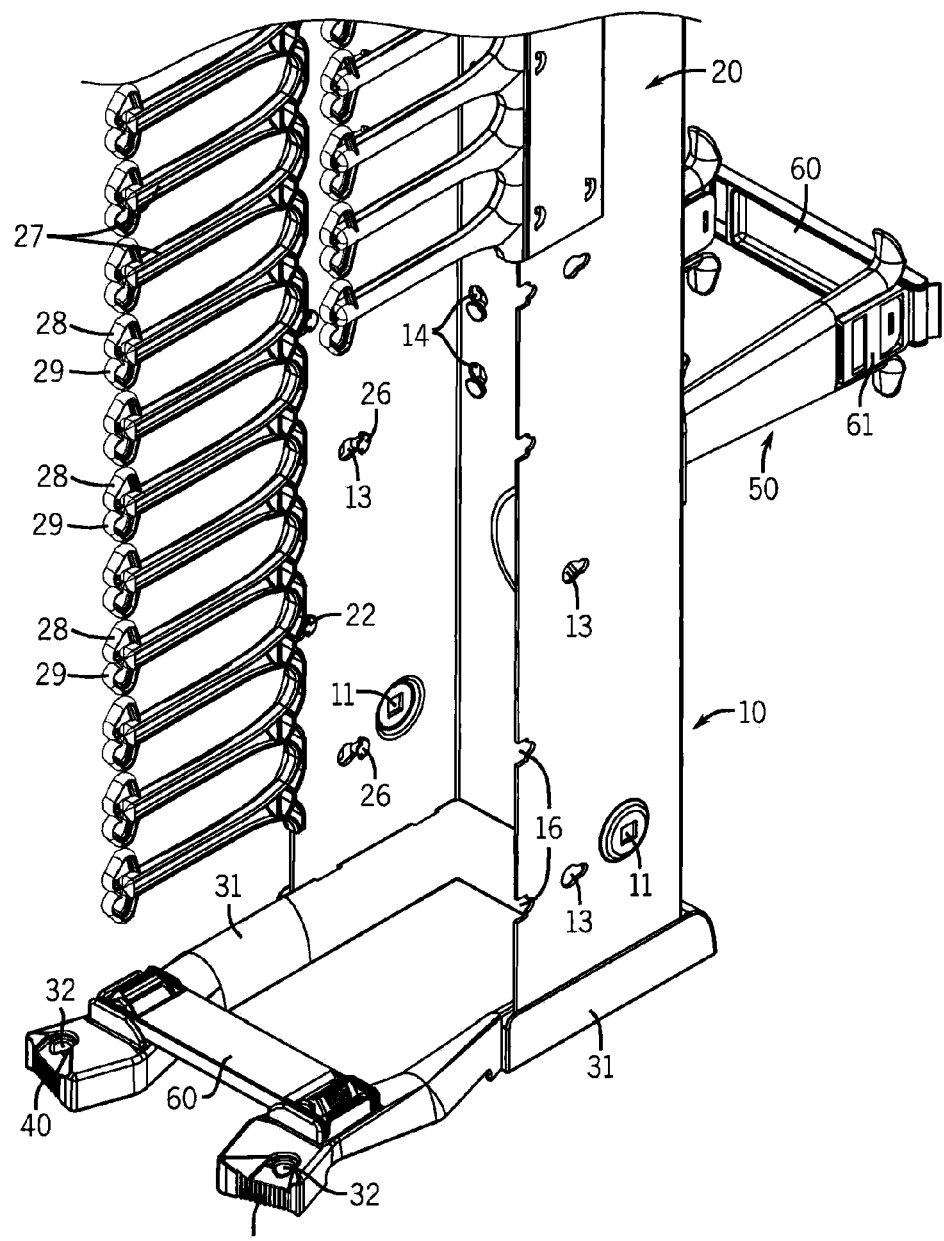
FIG. 7 is a side perspective view of the vertical cable manager showing mounting fixtures and apertures in addition to brackets used to install the door of FIG. 3A.

FIGS. 5A and 5B illustrate components used to build a vertical raceway, as shown in FIG. 6, on a rear portion of the trough 10. FIG. 5A illustrates the cross member 60 used for interconnecting two spools 50 to form the vertical raceway. The cross member 60 of FIG. 5A can also be used to interconnect the ends of the U-shaped door bracket 31, as shown in FIG. 7, to provide additional support for the door 30. FIG. 5B illustrates the connector 61 attached to two spools 50 and held into place by a locking flap 62 engaged with the notch 53 of the spool 50. The cross member 60 can be received by a slotted cylinder 63 (as shown in FIG. 6) which can form a separable connection between the cross member 60 and the connector 61 allowing rotational movement of the cross member 60.

FIG. 7 illustrates the vertical cable manager 1 with the door 30 detached. Several sets of fingers 20 are mounted on the trough 10 together with the raceway of FIG. 6 on the rear portion of the trough 10. An unoccupied space for an additional set of fingers 20 shows the notches 16 and the apertures 13 used to permanently couple a set of fingers 20 to the trough 10. The U-shaped bracket 31 for the door 30 is attached at the bottom of the trough 10. The bracket 31 can be manufactured from a single piece or can include an assembly of parts. The bracket 31 can include a hole 32 which receives the latch rod 35 of the door 30 (as shown in FIGS. 3A-3B). In order to facilitate the operation on the door, particularly its closing, the front of the bracket 31 can be chamfered to create a ramp 40 with an incline toward the hole 32. For additional stability of the bracket 31, the cross member 60 can be coupled to both exposed ends of the bracket 31.

It will be appreciated by those skilled in the art that while the invention has been described above in connection with particular embodiments and examples, the invention is not necessarily so limited, and that numerous other embodiments, examples, uses, modifications and departures from the embodiments, examples, and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

The invention claimed is:

1. A vertical cable manager comprising:
a vertical trough; and
at least one set of fingers extending along a length of the vertical trough,
  each finger of the at least one set of fingers including a shaft and an arrow-shaped end,
  the arrow-shaped end including a first triangular member coupled to the shaft at a first distance away from a distal end of the shaft,
  the arrow-shaped end including a second triangular member coupled to an opposite side of the shaft at the first distance away from the distal end of the shaft.

2. The vertical cable manager of claim 1 wherein at least one of the first triangular member and the second triangular member includes a first end coupled to the shaft and a second curved end extending beyond the distal end of the shaft.

3. The vertical cable manager of claim 1 wherein the shaft includes a rounded, non-circular cross section.

4. The vertical cable manager of claim 3 wherein the shaft includes a C-shaped cross section.

5. The vertical cable manager of claim 1 wherein each one of the at least one set of fingers includes a base that is substantially permanently fixed to the vertical trough.

6. The vertical cable manager of claim 1 wherein a plurality of identical sets of fingers are fixed to the length of the vertical trough.

7. The vertical cable manager of claim 1 and further comprising at least one spool removably coupled to the trough.

8. The vertical cable manager of claim 7 and further comprising a cross member; wherein the at least one spool includes two spools coupled to opposite sides of the trough; and wherein the cross member is positioned horizontally and coupled to each of the two spools.

9. The vertical cable manager of claim 1 wherein the at least one set of fingers is substantially permanently fixed to the vertical trough with molded fixtures and non-removable fasteners.

10. A vertical cable manager for use by a user, the vertical cable manager comprising:
a vertical trough including a first side and a second side;
at least one set of fingers extending along at least one of the first side and the second side;
a door removably coupled to the first side and removably coupled to the second side;
the door including a first latch rod, a second latch rod, a first latch, and a second latch;
the door including a first channel parallel to the first side and a second channel parallel to the second side; the first channel receiving the first latch rod and the second channel receiving the second latch rod;
a top bracket coupled to a top portion of the door and the vertical trough, the top bracket coupled above each one of the at least one set of fingers, the top bracket receiving the first latch rod and the second latch rod; and
a bottom bracket coupled to a bottom portion of the door and the vertical trough, the bottom bracket coupled below each one of the at least one set of fingers, the bottom bracket receiving the first latch rod and the second latch rod;
the door being removable from at least one of the first side and the second side by the user operating at least one of the first latch and the second latch with one hand.

11. The vertical cable manager of claim 10 wherein the first channel and the second channel extend along substantially an entire height of the door.

12. The vertical cable manager of claim 10 wherein the door includes at least one first hinge guide and at least one second hinge guide, the at least one first hinge guide receiving the first latch rod, the at least one second hinge guide receiving the second latch rod.

13. The vertical cable manager of claim 10 wherein each finger of the at least one set of fingers includes a shaft and an arrow-shaped end.

14. The vertical cable manager of claim 13 wherein the arrow-shaped end includes a first triangular member coupled to the shaft at a first distance away from a distal end of the shaft; and wherein the arrow-shaped end includes a second triangular member coupled to an opposite side of the shaft at the first distance away from the distal end of the shaft.

15. The vertical cable manager of claim 14 wherein at least one of the first triangular member and the second triangular member includes a first end coupled to the shaft and a second curved end extending beyond the distal end of the shaft.

16. The vertical cable manager of claim 13 wherein the shaft includes a rounded, non-circular cross section.

17. The vertical cable manager of claim 16 wherein the shaft includes a C-shaped cross section.

18. The vertical cable manager of claim 10 wherein each one of the at least one set of fingers includes a base that is substantially permanently fixed to the vertical trough.

19. The vertical cable manager of claim 10 and further comprising at least one spool removably coupled to the vertical trough.

20. The vertical cable manager of claim 19 and further comprising a cross member; wherein the at least one spool includes a first spool coupled to the first side of the vertical trough and a second spool coupled to the second side of the vertical trough; and wherein the cross member is positioned horizontally and coupled to the first spool and the second spool.

* * * * *